(12) United States Patent
Lam (10) Patent No.: US 12,362,752 B2
(45) Date of Patent: Jul. 15, 2025

(54) TRANSIENT INSENSITIVE LEVEL SHIFTER

(71) Applicant: TEXAS INSTRUMENTS INCORPORATED, Dallas, TX (US)

(72) Inventor: Yat Hei Lam, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 83 days.

(21) Appl. No.: 18/149,549

(22) Filed: Jan. 3, 2023

(65) Prior Publication Data

US 2024/0223190 A1 Jul. 4, 2024

(51) Int. Cl.
  H03K 19/0185 (2006.01)
  H03K 17/16 (2006.01)
  H03K 19/003 (2006.01)

(52) U.S. Cl.
  CPC ... *H03K 19/018507* (2013.01); *H03K 17/162* (2013.01); *H03K 19/00315* (2013.01); *H03K 2217/0063* (2013.01); *H03K 2217/0072* (2013.01)

(58) Field of Classification Search
  CPC ..... H03K 19/018507; H03K 19/00315; H03K 17/162; H03K 2217/0063; H03K 2217/0072
  See application file for complete search history.

(56) References Cited

U.S. PATENT DOCUMENTS 10,103,261 B1   10/2018 Assaad et al.
10,116,301 B2 * 10/2018 Fesler ............ H03K 19/018507
10,868,536 B1 * 12/2020 Ke ..................... H03K 3/35613
2018/0019749 A1   1/2018 Fesler
2019/0207026 A1   7/2019 Assaad

OTHER PUBLICATIONS

Liu et al., "A New Design Technique for Sub-Nanosecond Delay and 200 V/ns Power Supply Slew-Tolerant Floating Voltage Level Shifters for GaN SMPS," IEEE Transactions on Circuits and Systems—I: Regular Papers, vol. 66, No. 3, Mar. 2019, pp. 1280-1290.
International Search Report mailed May 14, 2024.

* cited by examiner

*Primary Examiner* — Menatoallah Youssef
*Assistant Examiner* — Colleen J O Toole
(74) *Attorney, Agent, or Firm* — Valerie M. Davis; Frank D. Cimino (57) ABSTRACT

In an example, a level shifter includes a low side having first and second inputs. The level shifter also includes a high side, where the high side has a latch having first and second terminals. The high side also includes a current comparator including first and second current mirrors. The high side includes isolation circuitry including first and second transistors, in which the first transistor has a first control terminal, the second transistor has a second control terminal, the first transistor is coupled between the first terminal and the first current mirror, the second transistor is coupled between the second terminal and the second current mirror, the first control terminal is coupled to the second current mirror, and the second control terminal is coupled to the first current mirror.

21 Claims, 8 Drawing Sheets

| CURRENT COMPARATOR INPUT CONDITIONS | V1 | V2 | SIG_OUT |
|---|---|---|---|
| $I_{SET}'/I_{RESET}' > N$ | HIGH | LOW | HIGH |
| $I_{RESET}'/I_{SET}' > N$ | LOW | HIGH | LOW |
| $1/N < I_{SET}'/I_{RESET}' < N$ (DEAD-ZONE) | LOW/HiZ | LOW/HiZ | HOLD |

TRANSIENT INSENSITIVE LEVEL SHIFTER

BACKGROUND

A level shifter interfaces between lower voltage circuitry and higher voltage circuitry. The level shifter safely translates signals between the higher voltage circuitry and the lower voltage circuitry. A level shifter may isolate and protect the lower voltage circuitry against higher voltages (from the higher voltage circuitry) that could otherwise damage the lower voltage circuitry. One application for a level shifter is the gate driver for a direct current (DC)-DC voltage converter.

SUMMARY

In accordance with at least one example of the description, a level shifter includes a low side having first and second inputs. The level shifter also includes a high side, where the high side has a latch having first and second terminals. The high side also includes a current comparator including first and second current mirrors. The high side includes isolation circuitry including first and second transistors, in which the first transistor has a first control terminal, the second transistor has a second control terminal, the first transistor is coupled between the first terminal and the first current mirror, the second transistor is coupled between the second terminal and the second current mirror, the first control terminal is coupled to the second current mirror, and the second control terminal is coupled to the first current mirror.

In accordance with at least one example of the description, a level shifter includes a high side having first and second inputs. The level shifter also includes a low side, where the low side has a latch having first and second terminals. The low side includes a current comparator including first and second current mirrors. The low side also includes isolation circuitry including first and second transistors, in which the first transistor has a first control terminal, the second transistor has a second control terminal, the first transistor is coupled between the first terminal and the first current mirror, the second transistor is coupled between the second terminal and the second current mirror, the first control terminal is coupled to the second current mirror, and the second control terminal is coupled to the first current mirror.

In accordance with at least one example of the description, a level shifter includes a low side having first and second inputs configured to receive one or more signals that switch an output of the level shifter. The level shifter also includes a high side that has a latch having first and second terminals. The high side also includes a current comparator including first and second current mirrors, where the current comparator is configured to perform a current comparison between a first current and a second current. The high side includes isolation circuitry including first and second transistors, in which the first transistor has a first control terminal, the second transistor has a second control terminal, the first transistor is coupled between the first terminal and the first current mirror, the second transistor is coupled between the second terminal and the second current mirror, the first control terminal is coupled to the second current mirror, and the second control terminal is coupled to the first current mirror, and where the isolation circuitry is configured to isolate the current comparator from the latch.

BRIEF DESCRIPTION OF THE DRAWINGS

The same reference numbers or other reference designators are used in the drawings to designate the same or similar (functionally and/or structurally) features.

DETAILED DESCRIPTION

DC-DC converters often use level shifters with gate drivers within the DC-DC converter. A level shifter is useful for translating logic signals between voltage supply domains. For example, a circuit may use voltage values of 1 V and 0 V to represent logic values 1 and 0 in a first domain, respectively. Another circuit may use voltage values of 5 V and 0 V to represent logic values 1 and 0 in a second domain, respectively. A level shifter shifts the level of a logic signal switching between 1 V and 0 V in the first domain into a logic signal switching between 5 V and 0 V in the second domain, which is referred to as a low to high level shifter.

A DC-DC converter may have a floating voltage supply for the high-side gate driver in the converter. The level shifter in the DC-DC converter may also have a high side and a low side. The level shifter in the DC-DC converter includes an output latch that can hold the level shifter's output signal if the input signal information is lost due to transient switching. If the high-side gate driver voltage domain switches to a different voltage domain, parasitic capacitances generate a common mode current in the level shifter. If the common mode current (e.g., switching noise) is great enough, the noise may toggle the output signal of the level shifter at times that the output should be stable.

In examples herein, the common mode signal that is coupled to the output latch of a low to high level shifter is canceled or rejected to preserve the state of the output latch. The level shifter architecture described herein creates an input dead zone that rejects the common mode signal. The dead zone systematically blocks noise provided to the output latch of the level shifter. Cross-coupled switches (e.g., transistors) isolate and/or disconnect the output latch of the level shifter from a current comparator within the level shifter if a difference between two input currents falls into the dead zone. The dead zone provides hysteresis that prevents the output latch from switching until an input signal provided to the level shifter is strong enough to overcome the hysteresis. The common mode currents are not strong enough to overcome the dead zone, and therefore the level shifter only switches if the proper input signal is supplied to the level shifter. The size of the dead zone may be scaled to any suitable value by adjusting the ratio of the size of certain transistors in the level shifter.

In another example, the common mode current may be canceled by using a common mode current sensing branch and current mirrors. This example may help the level shifter to shift faster responsive to a change in the input signal supplied to the level shifter. This example may also help a current comparator in the level shifter from being saturated by a large common mode current. In another example, a high to low level shifter may include the architecture described herein on the low side of the level shifter. The architecture in this example operates similarly to the low to high level shifter described above. The high to low level shifter may also include the common mode current sensing branch and current mirrors to cancel the common mode current in some examples.

Figure 1:
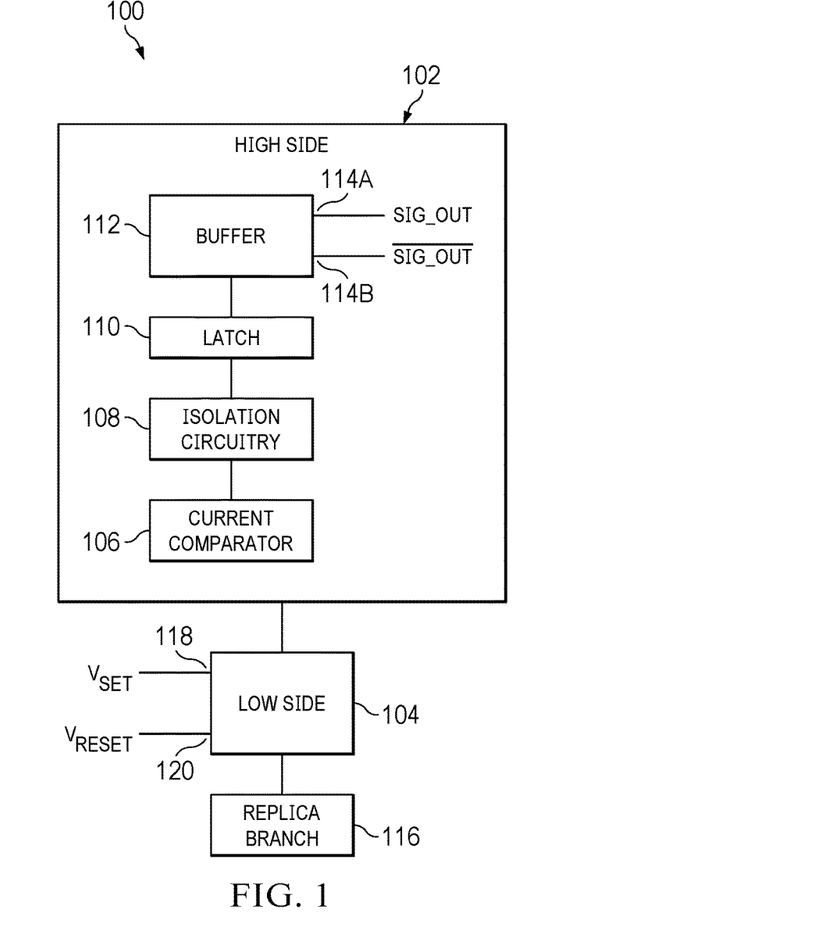
FIG. 1 is a block diagram of a level shifter in accordance with various examples.

FIG. 1 is a block diagram of a level shifter 100 in accordance with various examples herein. Level shifter 100 is a low to high level shifter in one example. Level shifter 100 includes a high side 102 coupled to a low side 104. High side 102 includes a current comparator 106, isolation circuitry 108, a latch 110, and a buffer 112. Buffer 112 has a first output 114A and a second output 114B. First output 114A provides an output signal SIG_OUT, and the second output 114B provides the inverse output signal $\overline{SIG\_OUT}$. The output signals may be provided to a gate driver for a DC-DC converter in one example. Low side 104 is coupled to an optional replica branch 116 in this example. Low side 104 also has two inputs, a $V_{SET}$ input 118 and a $V_{RESET}$ input 120.

In an example operation, pulse signals are provided to the $V_{SET}$ input 118 and/or the $V_{RESET}$ input 120 to toggle the output of latch 110, which output is then provided at first output 114A and second output 114B. The signals at first output 114A and second output 114B (SIG_OUT and $\overline{SIG\_OUT}$) are then provided to a gate driver to switch the DC-DC converter (not shown in FIG. 1). If the signals at $V_{SET}$ input 118 and $V_{RESET}$ input 120 are both low, the output of latch 110 holds its value. Level shifter 100 works by receiving the signals at $V_{SET}$ input 118 and $V_{RESET}$ input 120 and performing a current comparison with current comparator 106 in high side 102. The circuitry within current comparator 106 compares currents created by the signals provided at $V_{SET}$ input 118 and $V_{RESET}$ input 120. Based on these currents, current comparator 106 can provide a signal to latch 110 that switches the output of latch 110 as directed by the $V_{SET}$ and $V_{RESET}$ signals provided to low side 104.

In the example level shifter architecture described herein, isolation circuitry 108 resides between current comparator 106 and latch 110. Isolation circuitry 108 allows only one side of the circuitry within latch 110 to be pulled down by current comparator 106 at a time. Also, isolation circuitry 108 disconnects current comparator 106 from latch 110 if neither the $V_{SET}$ or the $V_{RESET}$ signal has been received by low side 104. Therefore, the output of level shifter 100 may only be toggled if a signal is received at $V_{SET}$ input 118 and $V_{RESET}$ input 120. Small variations in voltages or currents, such as common mode currents or parasitic currents and voltages within level shifter 100, are not strong enough to overcome the hysteresis provided by isolation circuitry 108. The amount of hysteresis (e.g., the dead zone) may be set based on a ratio of transistors within current comparator 106, as described below.

In another example, the optional component replica branch 116 may be added to level shifter 100. In some examples, level shifter 100 may switch often or have a high skew rate. This may produce a high common mode current. If the common mode current is high, the ratio between currents compared by current comparator 106 may be highly skewed in one direction, based on the values of the currents compared. The current comparator 106 could also be saturated by a large common mode current in an example. Replica branch 116 replicates the common mode current and helps to restore the ratio of the currents compared by current comparator 106 so accurate comparisons may be performed. In one example, replica branch 116 may fully subtract the common mode current before it reaches current comparator 106.

Figure 2:
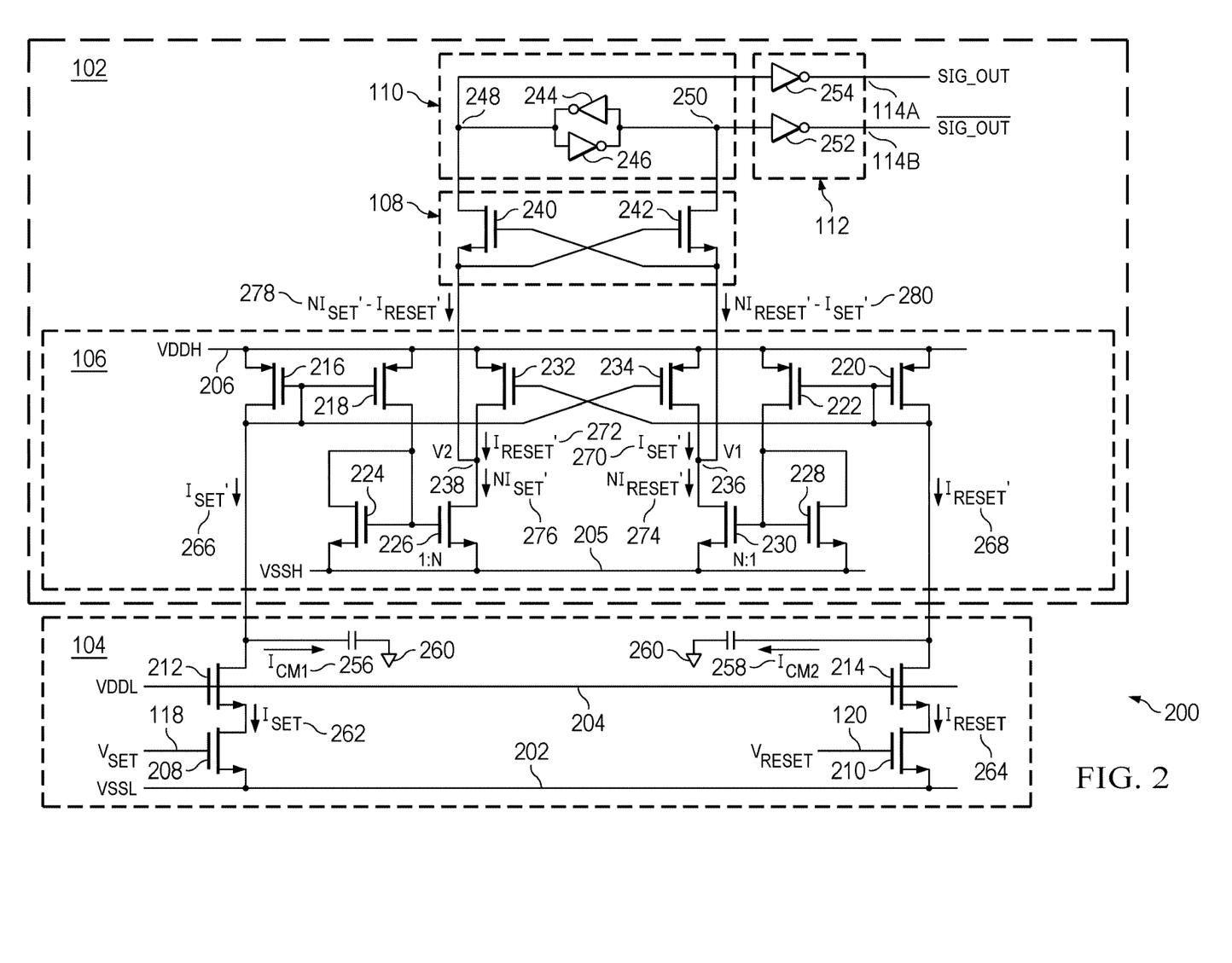
FIG. 2 is a circuit diagram of a level shifter in accordance with various examples.
Figure 6:
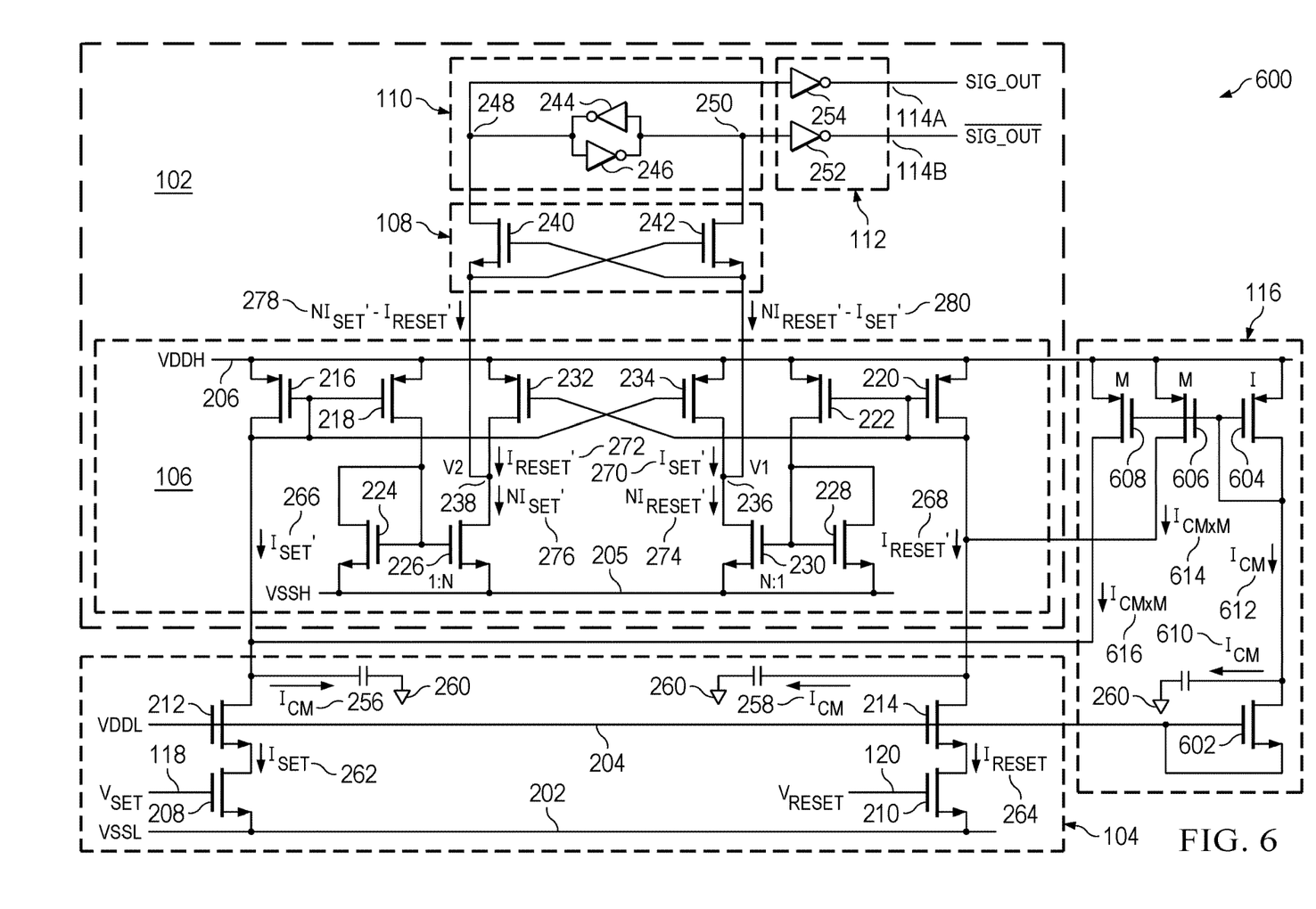
FIG. 6 is a circuit diagram of a level shifter in accordance with various examples.

FIGS. 2 and 6 below are circuit diagrams of a level shifter 100 that includes detailed circuitry not shown in FIG. 1. FIG. 2 provides an example without replica branch 116, and FIG. 6 provides an example that includes replica branch 116. A detailed example operation of the circuitry within level shifter 100 is provided with respect to those figures below.

FIG. 2 is a circuit diagram of a level shifter 200 in accordance with various examples herein. The operation of level shifter 200 is described in conjunction with FIGS. 3, 4 and 5 below. Level shifter 200 includes many of the components described above with respect to FIG. 1. Level shifter 200 includes high side 102, low side 104, current comparator 106, isolation circuitry 108, latch 110, and buffer 112. Level shifter 200 also includes first output 114A and second output 114B, $V_{SET}$ input 118, and $V_{RESET}$ input 120.

Level shifter 200 includes voltage rail VSSL 202, voltage rail VDDL 204, voltage rail VSSH 205, and voltage rail VDDH 206. VDDL 204 and VDDH 206 may have a voltage difference between them. In one example, VSSH 205 and VDDH 206 may have a voltage across them that is approximately a fixed voltage, while VSSL 202 and VDDL 204 may have a voltage across them that is approximately a fixed voltage. However, the voltage difference between VDDL 204 and VDDH 206 may fluctuate in some examples. Low side 104 includes transistor 208 having a gate coupled to $V_{SET}$ input 118. Transistor 210 has a gate coupled to $V_{RESET}$ input 120. Transistor 208 has a source coupled to VSSL 202 and a drain coupled to transistor 212. Transistor 210 has a source coupled to VSSL 202 and a drain coupled to transistor 214. Transistors 208, 210, 212, and 214 may be n-channel transistors in one example.

Transistor 212 includes a gate coupled to VDDL 204, a source coupled to transistor 208, and a drain coupled to transistor 216. Transistor 214 includes a gate coupled to VDDL 204, a source coupled to transistor 210, and a drain coupled to transistor 220.

Current comparator 106 resides within high side 102 in this example. Current comparator 106 includes a first current mirror that includes transistors 216 and 218. Current comparator 106 includes a second current mirror that includes transistors 220 and 222. Current comparator 106 includes a third current mirror that includes transistors 224 and 226. Current comparator 106 includes a fourth current mirror that includes transistors 228 and 230. Current comparator 106 also includes transistors 232 and 234. Current comparator 106 includes a node V1 236 and a node V2 238.

In this example, transistor 216 has a gate coupled to the gate of transistor 218, a source coupled to VDDH 206, and a drain coupled to transistor 212 and to the gates of transistors 216 and 218. Transistor 218 has a source coupled to VDDH 206 and a drain coupled to transistor 224. Transistors 216 and 218 may be p-channel transistors in one example.

Transistor 220 has a gate coupled to the gate of transistor 222, a source coupled to VDDH 206, and a drain coupled to transistor 214 and to the gates of transistors 220 and 222. Transistor 222 has a source coupled to VDDH 206 and a drain coupled to transistor 228. Transistors 216 and 218 may be p-channel transistors in one example.

Transistor 224 has a gate coupled to the gate of transistor 226 and to drain of transistor 224. Transistor 224 has a source coupled to VSSH 205. Transistor 226 has a source coupled to VSSH 205 and a drain coupled to node V2 238. In one example, transistors 224 and 226 have a ratio of 1:N, respectively. Transistors 224 and 226 may be n-channel transistors in one example.

Transistor 228 has a gate coupled to the gate of transistor 230 and to drain of transistor 228. Transistor 228 has a source coupled to VSSH 205. Transistor 230 has a source coupled to VSSH 205 and a drain coupled to node V1 236. In one example, transistors 228 and 230 have a ratio of 1:N, respectively. Transistors 228 and 230 may be n-channel transistors in one example.

Transistor 232 is cross-coupled with transistor 234. Transistor 232 has a gate coupled to the gates of transistors 220 and 222. Transistor 232 has a source coupled to VDDH 206 and a drain coupled to node V2 238. Transistor 234 has a gate coupled to the gates of transistors 216 and 218. Transistor 234 has a source coupled to VDDH 206 and a drain coupled to V1 236. Transistors 232 and 234 may be p-channel transistors in one example.

High side 102 also includes isolation circuitry 108. In this example, isolation circuitry 108 includes cross-coupled transistors 240 and 242. Transistor 240 includes a gate coupled to the source of transistor 242, a source coupled to node V2 238, and a drain coupled to latch 110. Transistor 242 includes a gate coupled to the source of transistor 240, a source coupled to node V1 236, and a drain coupled to latch 110. Transistors 240 and 242 may be n-channel transistors in one example. In other examples, isolation circuitry 108 may include different circuitry and perform the functions described herein.

High side 102 also includes latch 110. Latch 110 includes inverters 244 and 246. Latch 110 also includes nodes 248 and 250. An input of inverter 244 is coupled to node 250 and an output of inverter 246. An output of inverter 244 is coupled to node 248 and an input of inverter 246. The input of inverter 246 is coupled to node 248 and the output of inverter 244. An output of inverter 246 is coupled to node 250 and an input of inverter 244.

Nodes 248 and 250 are coupled to buffer 112. Buffer 112 includes inverters 252 and 254 in this example, but other circuitry may act as a buffer in other examples. Buffer 112 has a first output 114A that provides an output signal SIG_OUT, and a second output 114B provides the inverse output signal $\overline{SIG\_OUT}$.

Level shifter 200 also includes a variety of currents as shown in FIG. 2. $I_{CM1}$ 256 is a common mode current that flows to ground 260. $I_{CM2}$ 258 is a common mode current that flows to ground 260. $I_{SET}$ 262 is a current that flows through transistors 208 and 212. $I_{RESET}$ is a current that flows through transistors 210 and 214. $I_{SET'}$ 266 is the combination of $I_{CM1}$ 256 and $I_{SET}$ 262. $I_{RESET'}$ 268 is the combination of $I_{CM2}$ 258 and $I_{RESET}$ 264. $I_{SET'}$ 270 is a current that flows from transistor 234 to node V1 236. $I_{RESET'}$ 272 is a current that flows from transistor 232 to node V2 238. $NI_{RESET'}$ 274 is a current that flows from node V1 236 to transistor 230. $NI_{SET'}$ 276 is a current that flows from node V2 238 to transistor 226. Current 278 flows from transistor 240 in isolation circuitry 108 to node V2 238, and has the value of $NI_{SET'}-I_{RESET'}$ (e.g., current 276 minus current 272). Current 280 flows from transistor 242 in isolation circuitry 108 to node V1 236, and has the value of $NI_{RESET'}-I_{SET'}$ (e.g., current 274 minus current 270).

In operation, a high pulse may be applied at $V_{SET}$ input 118 or at $V_{RESET}$ input 120 to set or reset the SIG_OUT signal (e.g., at first output 114A and second output 114B). If both $V_{SET}$ input 118 and $V_{RESET}$ input 120 have a low signal, SIG_OUT holds its current value. The voltages produced at nodes V1 236 and V2 238 toggle the latch 110, and therefore toggle the SIG_OUT value. If the circuit components are matched, the common mode currents $I_{CM1}$ 256 and $I_{CM2}$ 258 are matched. However, because of process variations and other variations, the common mode currents are likely unmatched. Therefore, the unmatched common mode currents could cause the voltages at nodes V1 236 or V2 238 to toggle latch 110 if level shifter 200 did not include isolation circuitry 108. Isolation circuitry 108, the N:1 ratio of transistors 226 and 224, and the N:1 ratio of transistors 230 and 228 create the comparator dead zone that disconnects nodes V1 236 and V2 238 from latch 110 if the voltages at both nodes V1 236 and V2 238 are low. The output of level shifter 200 is only toggled if the difference between $I_{SET}$ 262 and $I_{RESET}$ 264 is high enough, which occurs only if a high pulse is applied at $V_{SET}$ input 118 or at $V_{RESET}$ input 120. Additional description of the operation of current comparator 106 is provided below.

Current comparator 106 is configured to compare $I_{SET}$ 262 with $I_{RESET}$ 264 to determine whether a pulse has been applied to either $V_{SET}$ input 118 or at $V_{RESET}$ input 120. If a pulse has been applied to either input, the current comparator 106 provides an output signal at either V1 node 236 or V2 node 238, and this output signal is applied to latch 110 via isolation circuitry 108 to toggle latch 110. As one example operation, if a high pulse is applied at $V_{SET}$ input 118 and the signal at $V_{RESET}$ input 120 is low, $I_{SET}$ 262 is higher than $I_{RESET}$ 264. $I_{SET'}$ 266 (the combination of $I_{CM1}$ 256 and $I_{SET}$ 262) is higher than $I_{RESET'}$ 268 (which is the combination of $I_{CM2}$ 258 and $I_{RESET}$ 264).

Both currents $I_{SET'}$ 266 and $I_{RESET'}$ 268 are mirrored in current comparator 106. The first current mirror (transistors 216 and 218) mirrors $I_{SET'}$ 266, and this current is mirrored again by the third current mirror (transistors 224 and 226). The third current mirror also has an N:1 ratio, so the current that flows through transistor 226 is $NI_{SET'}$ 276, which is N times larger than $I_{SET'}$ 266. Likewise, the second current mirror (transistors 220 and 222) mirrors $I_{RESET'}$ 268, and this current is mirrored again by the fourth current mirror (transistors 228 and 230). The fourth current mirror also has an N:1 ratio, so the current that flows through transistor 230 is $NI_{RESET'}$ 274, which is N times larger than $I_{RESET'}$ 268.

The gate connected transistors 232 and 234 in current comparator 106 are coupled to the first and second current mirrors. The gate of transistor 232 is coupled to the second current mirror (transistors 220 and 222). The second current mirror mirrors the current $I_{RESET'}$ 268, so $I_{RESET'}$ 268 is also provided by transistor 232 to node V2 238. The gate of transistor 234 is coupled to the first current mirror (transistors 216 and 218). The first current mirror mirrors the current $I_{SET'}$ 266, so $I_{SET'}$ 266 is also provided by transistor 234 to node V1 236.

As shown in level shifter 200, current comparator 106 compares $I_{RESET'}$ 272 (which is a mirror of $I_{RESET'}$ 268) to $NI_{SET'}$ 276 at node V2 238. Also, current comparator 106 compares $I_{SET'}$ 270 (which is a mirror of $I_{SET'}$ 266) to $NI_{RESET'}$ 274 at node V1 236. Nodes V1 236 and V2 238 provide the outputs of the current comparator 106. These outputs are provided to isolation circuitry 108, which then passes the appropriate signal to latch 110 to flip the latch depending on the outputs. In this example, $V_{SET}$ input 118 received the high pulse, so $NI_{SET'}$ 276 is much greater than $I_{RESET'}$ 272 at node V2 238. The voltage at node V2 238 is pulled low. The voltage at node V1 236 is higher, because node V1 236 compares the current $I_{SET'}$ 270 to $NI_{RESET'}$ 274. Because node V2 238 has a lower voltage and node V1 236 has a higher voltage, the gate to source voltage $V_{GS}$ of transistor 240 in isolation circuitry 108 is high. This high $V_{GS}$ turns on transistor 240, and node 248 in latch 110 is pulled low. Because node 248 is pulled low, the SIG_OUT signal at first output 114A becomes high. Level shifter 200 has therefore been set in this example. Transistor 240 is a first transistor in this example, and the gate of transistor 240 is a first control terminal. Transistor 240 is coupled between a first terminal (node 248) of latch 110 and a first current mirror (e.g., the current mirror that includes transistors 224 and 226).

Conversely, in the opposite case, $V_{RESET}$ input 120 receives the high pulse, so $NI_{RESET'}$ 274 is much greater than $I_{SET'}$ 236 at node V1 236. The voltage at node V1 236 is pulled low. The voltage at node V2 238 is higher, because node V2 238 compares the current $I_{RESET'}$ 272 to $NI_{SET'}$ 276. Because node V1 236 has a low voltage and node V2 238 has a higher voltage, the gate to source voltage $V_{GS}$ of transistor 242 in isolation circuitry 108 is high. This high $V_{GS}$ turns on transistor 242 and node 250 in latch 110 is pulled low. Because node 250 is pulled low, the $\overline{\text{SIG\_OUT}}$ signal at second output 114B becomes high. Level shifter 200 has therefore been reset. Transistor 242 is a second transistor in this example, and the gate of transistor 242 is a second control terminal. Transistor 242 is coupled between a second terminal (node 250) of latch 110 and a second current mirror (e.g., the current mirror that includes transistors 228 and 230).

In level shifter 200, if no pulse is received at either $V_{SET}$ input 118 or at $V_{RESET}$ input 120, the voltage values at node V1 236 and node V2 238 are low. If the voltages at node V1 236 and node V2 238 are low, the gate voltages at transistors 240 and 242 in isolation circuitry 108 are also low. These low gate voltages turn off transistors 240 and 242, which disconnects or isolates latch 110 from current comparator 106. As described below, because of the scaling value N for transistors 224, 226 and transistors 228, 230, a small variation in the currents $I_{SET'}$ 266 and $I_{RESET'}$ 268 caused by a difference in the common mode currents $I_{CM1}$ 256 and $I_{CM2}$ 258 is not enough to overcome the dead zone or the hysteresis in level shifter 200. The output of level shifter 200 will therefore not toggle responsive to noise in the circuitry, but will only toggle if a large enough signal is provided at either $V_{SET}$ input 118 or at $V_{RESET}$ input 120. The high signals at either $V_{SET}$ input 118 or at $V_{RESET}$ input 120 cause a high ratio between $I_{SET}$ 262 and $I_{RESET}$ 264, which allows the output of level shifter 200 to toggle.

Figure 3:
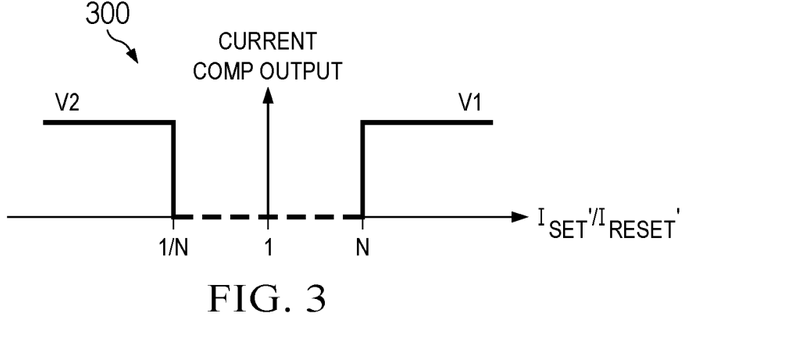
FIG. 3 is a graph of current comparator output in accordance with various examples.

FIG. 3 is a graph 300 of current comparator 106 output in accordance with various examples herein. In graph 300, the x-axis represents the ratio between $I_{SET'}$ 266 and $I_{RESET'}$ 268. The y-axis represents the output of the current comparator 106, which is represented by a high or low signal at either node V1 236 or node V2 238.

As shown in graph 300, if the ratio between $I_{SET'}$ 266 and $I_{RESET'}$ 268 is 1:1, the current comparator 106 output is low. If the ratio between $I_{SET'}$ 266 and $I_{RESET'}$ 268 becomes N or greater responsive to a pulse provided at $V_{SET}$ input 118, the voltage at node V1 236 goes high. As described above, a high voltage at node V1 236 turns on transistor 240 in isolation circuitry 108, pulls node 248 low, and the SIG_OUT signal at first output 114A becomes high.

In another example, if the ratio between $I_{SET'}$ 266 and $I_{RESET'}$ 268 becomes 1/N or less responsive to a pulse provided at $V_{RESET}$ input 120, the voltage at node V2 238 goes high. As described above, a high voltage at node V2 238 turns on transistor 242 in isolation circuitry 108, pulls node 250 low, and the $\overline{\text{SIG\_OUT}}$ signal at second output 114B becomes high (causing SIG_OUT to become low).

Figure 4:
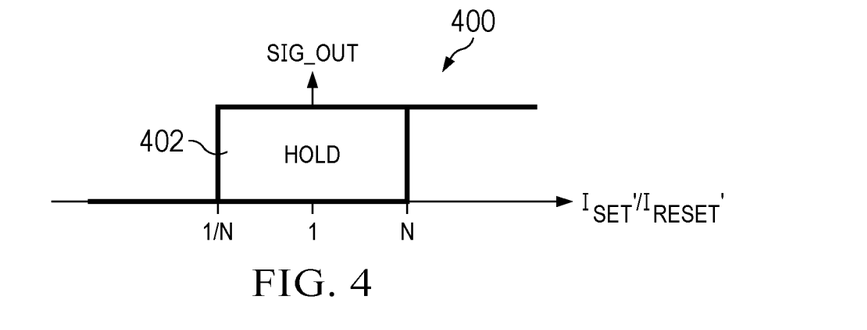
FIG. 4 is a graph of level shifter output in accordance with various examples.

FIG. 4 is a graph 400 of level shifter 200 output in accordance with various examples herein. In graph 400, the x-axis represents the ratio between $I_{SET'}$ 266 and $I_{RESET'}$ 268. The y-axis represents the output of level shifter, which is represented by a high or low signal at first output 114A. As described above with respect to FIG. 3, if the ratio between $I_{SET'}$ 266 and $I_{RESET'}$ 268 becomes N or greater responsive to a pulse provided at $V_{SET}$ input 118, SIG_OUT goes high. If the ratio between $I_{SET'}$ 266 and $I_{RESET'}$ 268 becomes 1/N or less responsive to a pulse provided at $V_{RESET}$ input 120, SIG_OUT goes low. If the ratio between $I_{SET'}$ 266 and $I_{RESET'}$ 268 is between 1/N and N, SIG_OUT will hold its current value, which is represented by the HOLD area 402 in graph 400.

As shown in graph 400, the size of the HOLD area 402 may be increased or decreased by altering the value of N. N is the ratio between transistors 224, 226 and 228, 230 as described above. A large N provides a large hold area 402, and requires a stronger signal at either $V_{SET}$ input 118 or at $V_{RESET}$ input 120 to toggle level shifter 200. A large N provides a large amount of protection against accidental toggling because of noise, common mode currents, etc. A smaller value of N provides a smaller hold area 402, and a relatively weaker signal at either $V_{SET}$ input 118 or at $V_{RESET}$ input 120 may be useful for toggling level shifter 200. A smaller N may provide less protection against accidental toggling than a larger N, but could allow for toggling with a weaker input signal received at $V_{SET}$ input 118 or at $V_{RESET}$ input 120.

Figure 5:
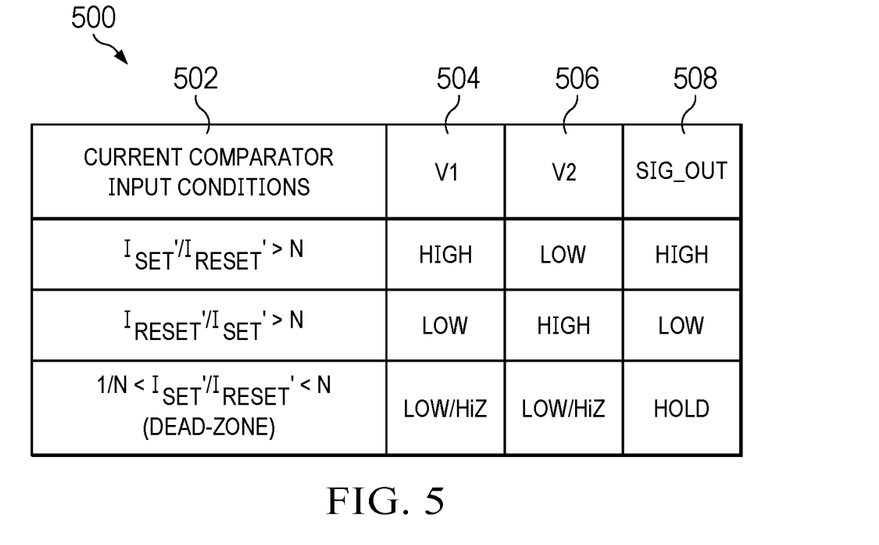
FIG. 5 is a table of level shifter output conditions in accordance with various examples.

FIG. 5 is a table 500 of level shifter 200 output conditions in accordance with various examples herein. Table 500 has four columns 502, 504, 506, and 508. The first column 502 is the current comparator 106 input conditions. The current comparator 106 input conditions are represented by the ratio between $I_{SET'}$ 266 and $I_{RESET'}$ 268 with respect to N. The second column 504 is the voltage value at node V1 236. The third column 506 is the voltage value at node V2 238. The fourth column 508 is the value of the output signal SIG_OUT.

In the first example, the ratio of $I_{SET'}$ 266 to $I_{RESET'}$ 268 is greater than N (e.g., $I_{SET}/I_{RESET}>N$). This situation occurs if a pulse is received at $V_{SET}$ input 118. In this example, the voltage at node V1 236 is high, the voltage at node V2 238 is low, and the output signal SIG_OUT becomes high.

In the second example, the ratio of $I_{RESET'}$ 268 to $I_{SET'}$ 266 is greater than N (e.g., $I_{RESET}/I_{SET}>N$). This situation occurs if a pulse is received at $V_{RESET}$ input 120. In this example, the voltage at node V1 236 is low, the voltage at node V2 238 is high, and the output signal SIG_OUT becomes low.

In the third example, the ratio of $I_{SET'}$ 266 to $I_{RESET'}$ 268 is between 1/N and N (e.g., $1/N<I_{SET}/I_{RESET}<N$). This ratio represents the dead zone, where a pulse has not been received at either $V_{SET}$ input 118 or at $V_{RESET}$ input 120. In this example, the voltage at node V1 236 is low (or high impedance, HiZ), the voltage at node V2 238 is low (or high impedance, HiZ), and the output signal SIG_OUT holds its current value. With this ratio of $I_{SET'}$ 266 to $I_{RESET'}$ 268, the output signal SIG_OUT of level shifter does not change responsive to common mode noise or other noise. An input pulse at $V_{SET}$ input 118 or at $V_{RESET}$ input 120 is needed to change the value of SIG_OUT. Table 500 therefore shows the advantages of the dead zone created by isolation circuitry 108 and the transistor ratio N.

FIG. 6 is a circuit diagram of a level shifter 600 with a replica branch 116 in accordance with various examples herein. Level shifter 600 includes many of the components described above with respect to FIGS. 1 and 2, and like numerals denote like components. Level shifter 600 includes high side 102, low side 104, current comparator 106, isolation circuitry 108, latch 110, and buffer 112. Level shifter 600 also includes first output 114A and second output 114B, $V_{SET}$ input 118, and $V_{RESET}$ input 120.

Level shifter 600 operates similarly to level shifter 200 as described above with respect to FIG. 2. Therefore, a detailed description of the operation of high side 102 and low side 104 within level shifter 600 is omitted herein. Level shifter 600, however, also includes replica branch 116. Replica branch 116 may be useful for a level shifter that frequently switches or has a high skew rate. In those cases, a high common mode current may occur. With a high common mode current, the value of $I_{SET}$ 262 may vary greatly from the value of $I_{SET'}$ 266. Likewise, the value of $I_{RESET}$ 264 may vary greatly from the value of $I_{RESET'}$ 268. The high common mode current may disturb the ratio between $I_{SET}$ 262 and $I_{RESET}$ 264. With replica branch 116, currents may be added that adjust the ratio between $I_{SET}$ 262 and $I_{RESET}$ 264.

Replica branch 116 includes transistors 602, 604, 606, and 608. Transistor 602 has a source coupled to a gate, which is also coupled to the gate of transistor 214. A drain of transistor 602 is coupled to a drain of transistor 604. Transistor 604 has a gate coupled to a drain, and has a source coupled to VDDH 206. The gate of transistor 604 is also coupled to the gate of transistor 606. Transistor 606 has a gate coupled to the gates of transistors 604 and 608, a source coupled to VDDH 206, and a drain coupled to a drain of transistor 214. Transistor 608 has a gate coupled to the gate of transistor 606, a source coupled to VDDH 206, and a drain coupled to the drain of transistor 212.

In an example, transistors 606 and 608 have a size ratio of M:1 compared to transistor 604. Transistors 606 and 608 may be sized by a factor M to adjust how much common mode current $I_{CM}$ should be canceled. In some examples, M is 1. M may be set higher to compensate for process, voltage, temperature, and manufacturing variations in other examples. If M is set too high, $I_{SET}$ 262 may be much higher than $I_{SET'}$ 266, and $I_{SET'}$ 266 may not be high enough in some examples for the proper operation of current comparator 106. Therefore, a value of M that is 1 or slightly higher than 1 is useful in many examples.

Replica branch 116 also includes currents $I_{CM}$ 610, $I_{CM}$ 612, $I_{CM \times M}$ 614, and $I_{CM \times M}$ 616. In an example, $I_{CM2}$ 258 is mirrored by transistor 602 to produce $I_{CM}$ 610. $I_{CM}$ 610 is equal to $I_{CM}$ 612. Transistors 604 and 606 mirror $I_{CM}$ 612 to produce $I_{CM \times M}$ 614. $I_{CM \times M}$ 614 has the value of $I_{CM}$ 612 multiplied by the transistor ratio M. Transistor 608 also operates as a current mirror to create $I_{CM \times M}$ 616. $I_{CM \times M}$ 614 is provided by transistor 606 to the $I_{RESET}$ branch of low side 104, which includes transistors 210 and 214. $I_{CM \times M}$ 614 may wholly or partially cancel $I_{CM2}$ 258 in one example, which makes $I_{RESET}$ 264 approximately equal to $I_{RESET'}$ 268. Likewise, $I_{CM \times M}$ 616 is provided by transistor 608 to the $I_{SET}$ branch of low side 104, which includes transistors 208 and 212. $I_{CM \times M}$ 616 may wholly or partially cancel $I_{CM1}$ 256 in one example, which makes $I_{SET}$ 262 approximately equal to $I_{SET'}$ 266.

In one example, transistor 602 is a replica of transistors 212 and 214. These transistors may have similar parasitic capacitances which provides for better cancellation of the common mode currents. These three transistors may be high voltage transistors with a higher capacitance at the drain terminal in one example.

Figure 7:
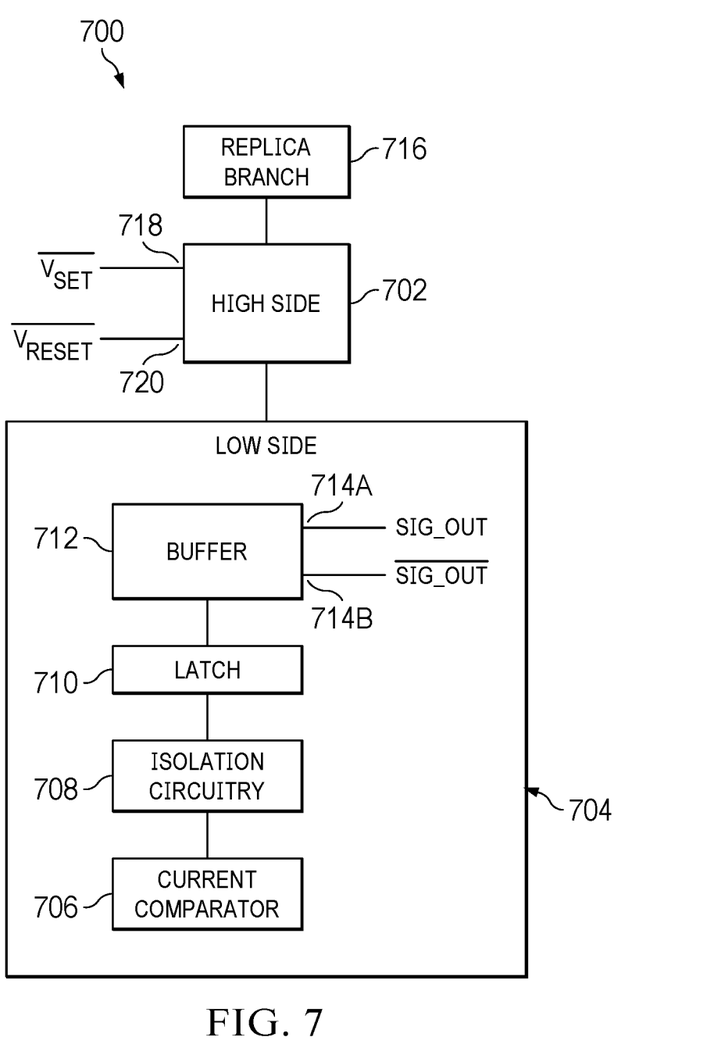
FIG. 7 is a block diagram of a level shifter in accordance with various examples.

FIG. 7 is a block diagram of a level shifter 700 in accordance with various examples herein. Level shifter 100 is a high to low level shifter in one example. Level shifter 700 includes a high side 702 coupled to a low side 704. Low side 704 includes a current comparator 706, isolation circuitry 708, a latch 710, and a buffer 712. Buffer 712 has a first output 714A and a second output 714B. First output 714A provides an output signal SIG_OUT, and the second output 714B provides the inverse output signal $\overline{\text{SIG\_OUT}}$. The output signals may be provided to a gate driver for a DC-DC converter in one example. High side 702 is coupled to an optional replica branch 716 in this example. High side 702 also has two inputs, a $V_{SET}$ input 718 and a $V_{RESET}$ input 720.

Level shifter 700 operates similarly to level shifter 100 described above, except level shifter 700 provides an output at low side 704 rather than at the high side 702. Current comparator 706, isolation circuitry 708, latch 710, buffer 712, and replica branch 716 operate similarly to their counterpart components described above with respect to FIGS. 1, 2, and 6.

Figure 8:
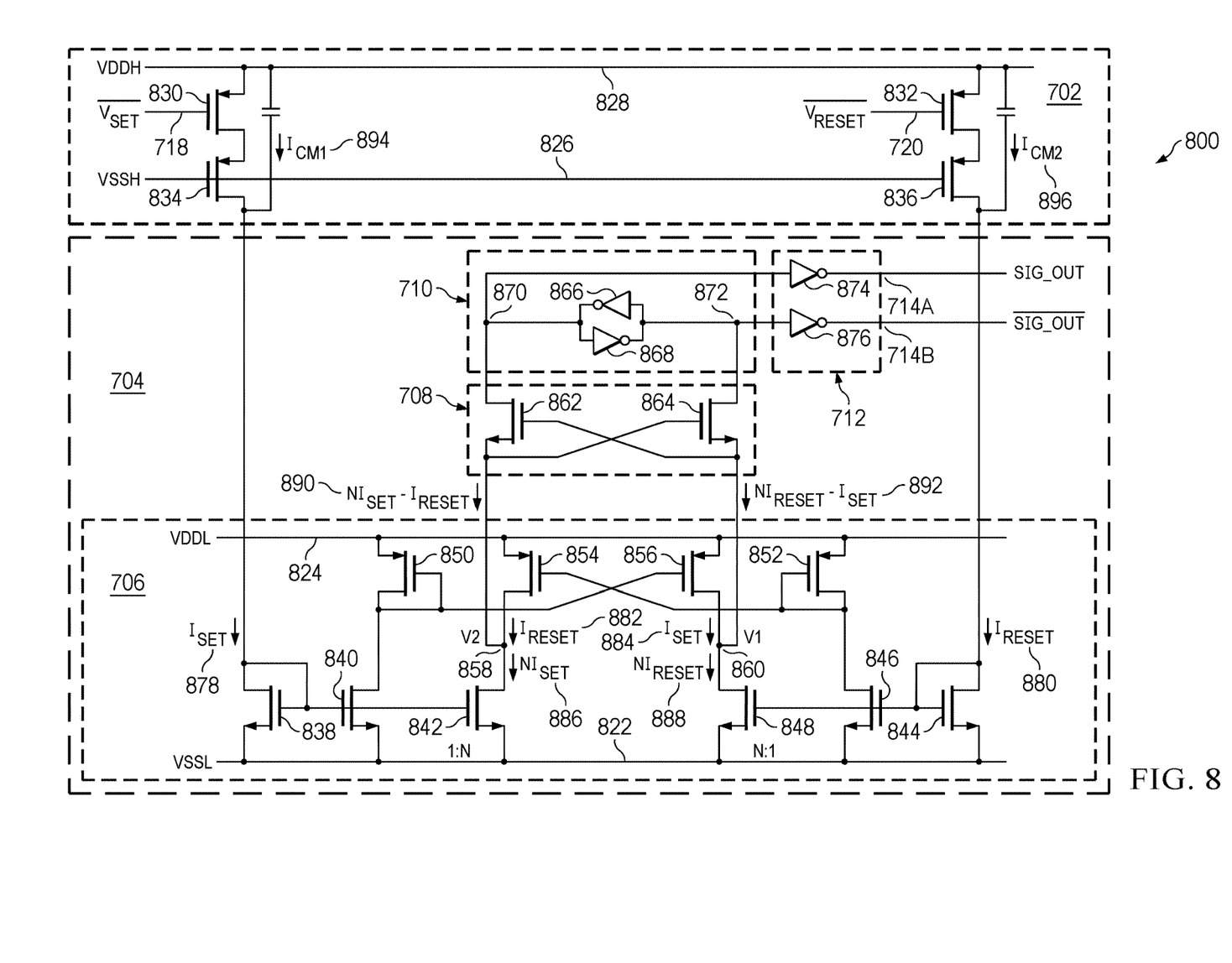
FIG. 8 is a circuit diagram of a level shifter in accordance with various examples.
Figure 9:
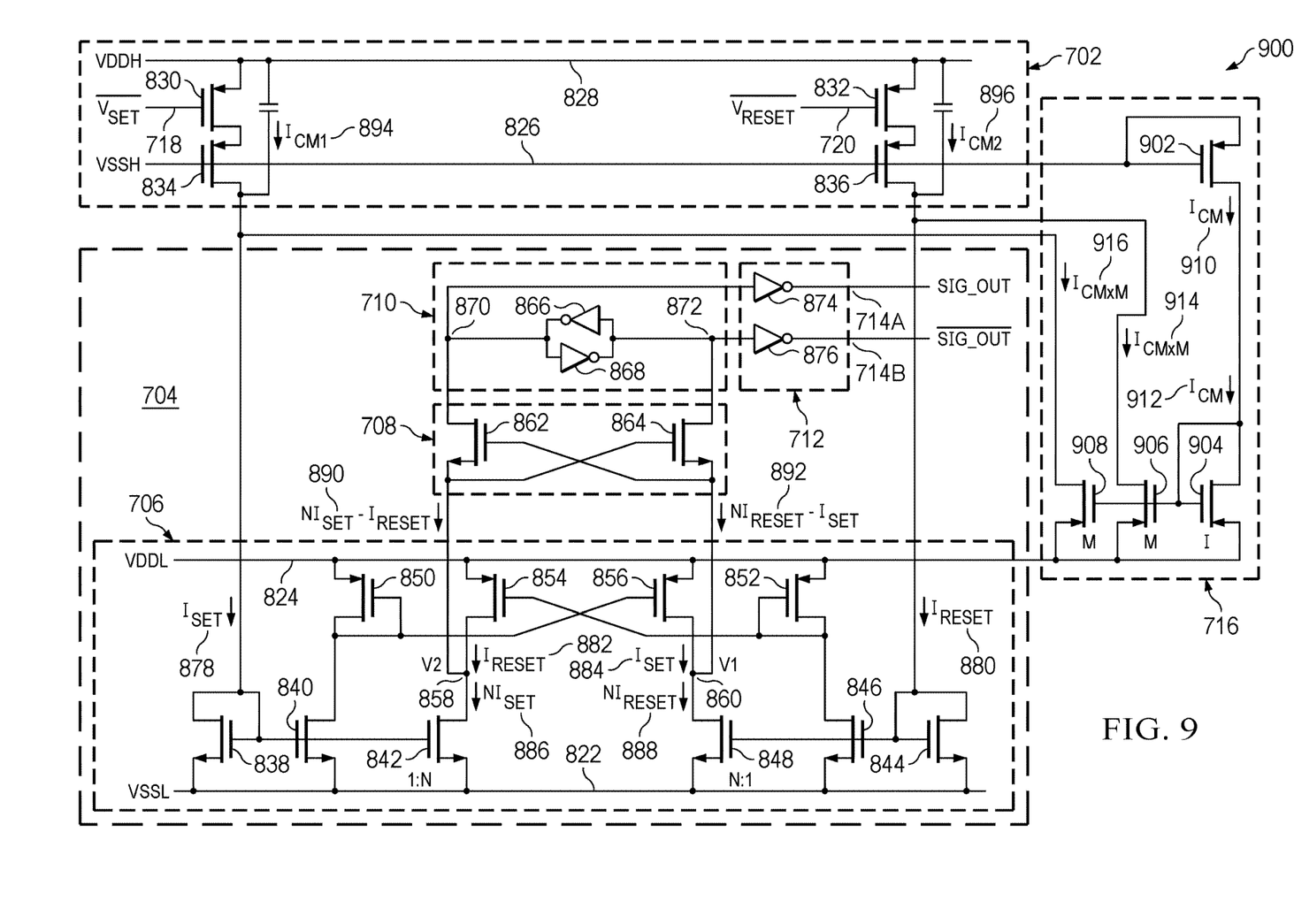
FIG. 9 is a circuit diagram of a level shifter in accordance with various examples.

FIGS. 8 and 9 described below are circuit diagrams of a level shifter 700 that includes detailed circuitry not shown in FIG. 7. FIG. 8 provides an example without replica branch 716, and FIG. 9 provides an example that includes replica branch 716.

FIG. 8 is a circuit diagram of a level shifter 800 in accordance with various examples herein. Level shifter 800 includes many of the components described above with respect to FIG. 7. Level shifter 800 includes high side 702, low side 704, current comparator 706, isolation circuitry 708, latch 710, and buffer 712. Level shifter 800 also includes first output 714A and second output 714B, $V_{SET}$ input 718, and $V_{RESET}$ input 720.

Level shifter 800 includes voltage rails VSSL 822, VDDL 824, VSSH 826, and VDDH 828. Level shifter 800 also includes transistors 830, 832, 834, and 836 in high side 702. Transistor 830 includes a gate coupled to $V_{SET}$ input 718, a source coupled to VDDH 828, and a drain coupled to a source of transistor 834. Transistor 832 includes a gate coupled to $V_{RESET}$ input 720, a source coupled to VDDH 828, and a drain coupled to a source of transistor 836. Transistor 834 includes a gate coupled to VSSH 826, a source coupled to the drain of transistor 830, and a drain coupled to transistor 838 in low side 704. Transistor 836 includes a gate coupled to VSSH 826, a source coupled to the drain of transistor 832, and a drain coupled to transistor 844 in low side 704. Transistors 830, 832, 834, and 836 may be p-channel transistors in some examples. The transistors 830, 832 834, and 836 operate similarly to transistors 208, 210, 212, and 214 described above with respect to FIG. 2, so a detailed operation of these transistors is omitted herein.

Level shifter 100 includes current comparator 706 in low side 704. Current comparator 706 includes transistors 838 and 840, which operate as a current mirror. Transistor 838 includes a gate coupled to the gate of transistor 840 and to the drain of transistor 838. Transistor 838 includes a source coupled to VSSL 822. Transistor 840 includes a gate coupled to the gates of transistors 838 and 842, a source coupled to VSSL 822, and a drain coupled to a drain of transistor 850. Transistors 842 and 840 may have an N:1 ratio in some examples. Transistor 842 includes a source coupled to VSSL 822 and a drain coupled to node V2 858. Transistors 838, 840, 842, and 850 are on the $I_{SET}$ 878 side of current comparator 706. Transistors 838, 840, and 842 may be n-channel transistors in one example. Transistor 850 may be a p-channel transistor in one example.

Current comparator 706 includes transistors 844 and 846, which operate as a current mirror. Transistor 844 includes a gate coupled to the gate of transistor 846 and to the drain of transistor 844. Transistor 844 includes a source coupled to VSSL 822. Transistor 846 includes a gate coupled to the gates of transistors 844 and 848, a source coupled to VSSL 822, and a drain coupled to a drain of transistor 852. Transistors 848 and 846 may have an N:1 ratio in some examples. Transistor 848 includes a source coupled to VSSL 822 and a drain coupled to node V1 860. Transistors 844, 846, 848, and 852 are on the $I_{RESET}$ 880 side of current comparator 706. Transistors 844, 846, and 848 may be n-channel transistors in one example. Transistor 852 may be a p-channel transistor in one example.

Current comparator 706 also includes transistors 850, 852, 854, and 846. Current comparator includes nodes V1 860 and V2 858 in this example. Transistor 850 has a gate coupled to the gate of transistor 856 and to the drain of transistor 850. Transistor 850 has a source coupled to VDDL 824. Transistor 852 has a gate coupled to the gate of transistor 854 and to the drain of transistor 852. Transistor 852 has a source coupled to VDDL 824. Transistor 854 has a gate coupled to the gate of transistor 852, a drain coupled to node V2 858, and a source coupled to VDDL 824. Transistor 856 has a gate coupled to the gate of transistor 850, a drain coupled to node V1 860, and a source coupled to VDDL 824. Transistors 854 and 856 may be p-channel transistors in one example.

Isolation circuitry 708 in low side 704 includes two cross coupled transistors 862 and 864. A gate of transistor 862 is coupled to the source of transistor 864 and node V1 860. A source of transistor 862 is coupled to the gate of transistor 864 and node V2 858. A drain of transistor 862 is coupled to node 870 in latch 710. A gate of transistor 864 is coupled to the source of transistor 862 and node V2 858. A source of transistor 864 is coupled to the gate of transistor 862 and node V1 860. A drain of transistor 864 is coupled to node 872 in latch 710. In an example, transistors 862 and 864 are p-channel transistors.

Latch 710 in low side 704 includes inverters 866 and 868. Latch 710 also includes nodes 870 and 872. An input of inverter 866 is coupled to node 872 and an output of inverter 868. An output of inverter 866 is coupled to node 870 and an input of inverter 868. The input of inverter 868 is coupled to node 870 and the output of inverter 866. An output of inverter 868 is coupled to node 872 and an input of inverter 866.

Nodes 870 and 872 are coupled to buffer 712. Buffer 712 includes inverters 874 and 876 in this example, but other circuitry may act as a buffer in other examples. Buffer 712 has a first output 714A that provides an output signal SIG_OUT, and a second output 714B provides the inverse output signal $\overline{\text{SIG\_OUT}}$.

Level shifter 800 also includes currents $I_{SET}$ 878, $I_{RESET}$ 880, $I_{RESET}$ 882, $I_{SET}$ 884, $NI_{SET}$ 886, and $NI_{RESET}$ 888. Currents 890 ($NI_{SET}$-$I_{RESET}$) and 892 ($NI_{RESET}$-$I_{SET}$) are also shown in FIG. 8. The common mode currents $I_{CM1}$ 894 and $I_{CM2}$ 896 are also shown. Level shifter 800 operates similarly to level shifter 200 described above with respect to FIG. 2. For example, current comparator 706, isolation circuitry 708, latch 710, and buffer 712 operate similarly to their counterpart components current comparator 106, isolation circuitry 108, latch 110, and buffer 112 described above with respect to FIGS. 1 and 2. Therefore, a detailed description of this operation is omitted herein.

In one example, current comparator 706 is configured to compare $I_{SET}$ 878 with $I_{RESET}$ 880 to determine whether a pulse has been applied to either $V_{SET}$ input 718 or at $V_{RESET}$ input 720. If a pulse has been applied to either input, the current comparator 706 provides an output signal at either V1 node 860 or V2 node 858, and this output signal is applied to latch 710 via isolation circuitry 708 to toggle latch 710.

FIG. 9 is a circuit diagram of a level shifter 900 with a replica branch in accordance with various examples herein. Level shifter 900 includes many of the components described above with respect to FIG. 8, and like numerals denote like components. Level shifter 900 includes high side 702, low side 704, current comparator 706, isolation circuitry 708, latch 710, and buffer 712. Level shifter 900 also includes first output 714A and second output 714B, $V_{SET}$ input 718, and $V_{RESET}$ input 720.

Level shifter 900 operates similarly to level shifter 800 as described above with respect to FIG. 8. Level shifter 900, however, also includes replica branch 716. Replica branch 716 operates similarly to replica branch 116 described above with respect to FIG. 6.

Replica branch 716 may be useful for a level shifter that frequently switches or has a high skew rate. In those cases, a high common mode current may occur. The high common mode current may disturb the ratio between $I_{SET}$ 878 and $I_{RESET}$ 880. With replica branch 716, currents may be added that adjust the ratio between $I_{SET}$ 878 and $I_{RESET}$ 880.

Replica branch 716 includes transistors 902, 904, 906, and 908. Transistor 902 has a source coupled to a gate, which is also coupled to the gate of transistor 836. A drain of transistor 902 is coupled to a drain of transistor 904. Transistor 904 has a gate coupled to a drain, and has a source coupled to VDDL 824. The gate of transistor 904 is also coupled to the gate of transistor 906. Transistor 906 has a gate coupled to the gates of transistors 904 and 908, a source coupled to VDDL 824, and a drain coupled to a drain of transistor 836. Transistor 908 has a gate coupled to the gate of transistor 906, a source coupled to VDDL 824, and a drain coupled to the drain of transistor 834.

In an example, transistors 906 and 908 have a size ratio of M:1 compared to transistor 904. Transistors 906 and 908 may be sized by a factor M to adjust how much common mode current $I_{CM}$ should be canceled. In some examples, M is 1. M may be set higher to compensate for process, voltage, temperature, and manufacturing variations in other examples. A value of M that is 1 or slightly higher than 1 is useful in many examples.

Replica branch 716 also includes currents $I_{CM}$ 910, $I_{CM}$ 912, $I_{CM \times M}$ 914, and $I_{CM \times M}$ 916. In an example, a common mode current in high side 702 is mirrored by transistor 602 to produce $I_{CM}$ 910. $I_{CM}$ 910 is equal to $I_{CM}$ 912. Transistors 904 and 906 mirror $I_{CM}$ 912 to produce $I_{CM \times M}$ 914. $I_{CM \times M}$ 914 has the value of $I_{CM}$ 912 multiplied by the transistor ratio M. Transistor 908 also operates as a current mirror to create $I_{CM \times M}$ 916. $I_{CM \times M}$ 914 is provided by transistor 906 to the $I_{RESET}$ branch of high side 702, which includes transistors 832 and 836. $I_{CM \times M}$ 914 may wholly or partially cancel a common mode current in one example. Likewise, $I_{CM \times M}$ 916 is provided by transistor 908 to the $I_{SET}$ branch of high side 702, which includes transistors 830 and 834. $I_{CM \times M}$ 916 may wholly or partially cancel a common mode current in one example.

In one example, transistor 902 is a replica of transistors 834 and 836. These transistors may have similar parasitic capacitances which provides for better cancellation of the common mode currents. These three transistors may be high voltage transistors with a higher capacitance at the drain terminal in one example.

Figure 10:
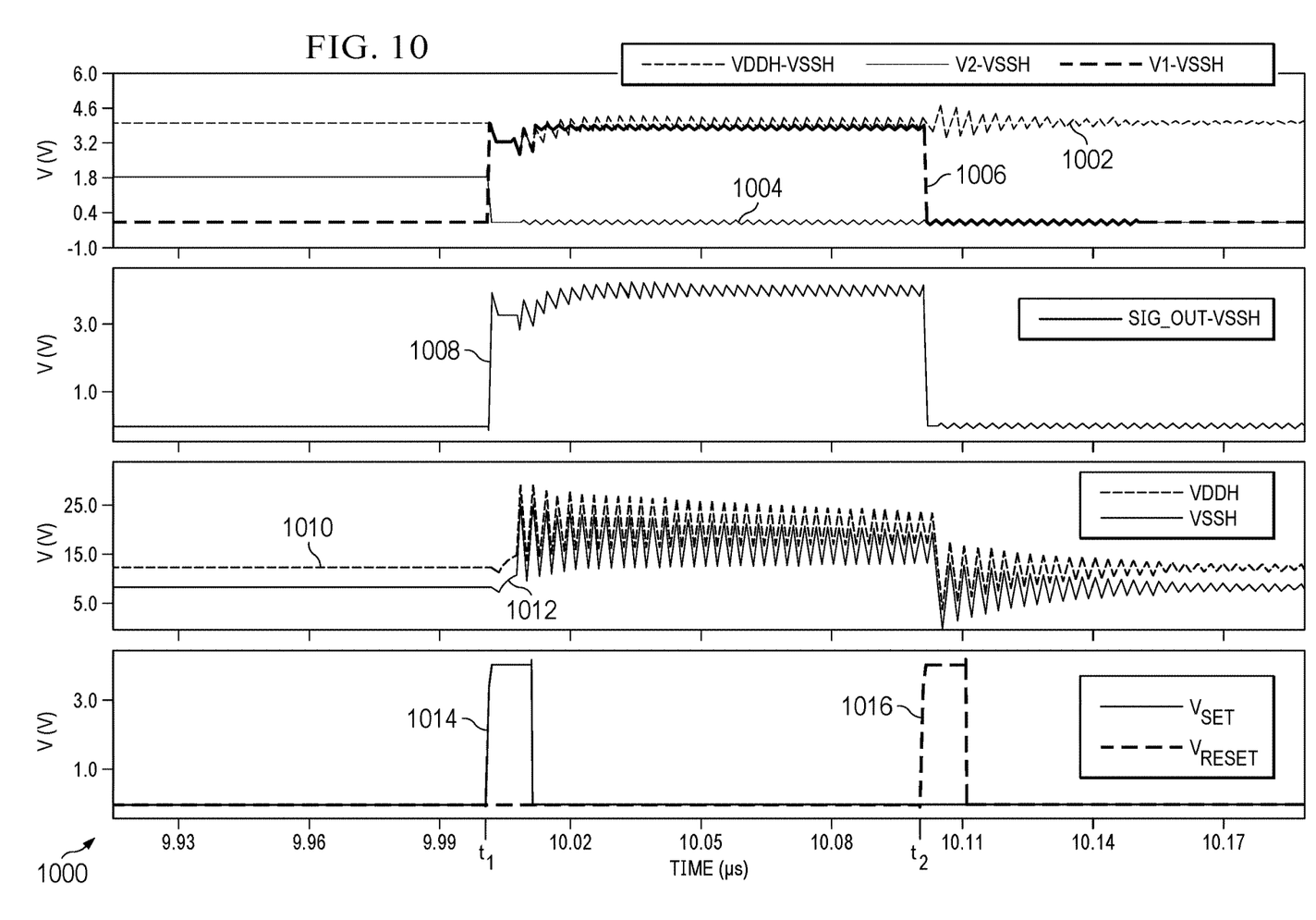
FIG. 10 is a set of graphs of voltage waveforms for a level shifter in accordance with various examples.

FIG. 10 is a set of graphs 1000 of voltage waveforms for a level shifter in accordance with various examples herein. FIG. 10 may include simulations for a collection of voltage waveforms for level shifter 200 in one example.

Waveform 1002 represents the voltage difference between VDDH 206 and VSSH 205 (VDDH−VSSH). Waveform 1004 represents the voltage difference between node V2 238 and VSSH 205 (V2−VSSH). Waveform 1006 represents the voltage difference between nod V1 236 and VSSH 205 (V1−VSSH). Therefore, these voltages are shown in graphs 1000 with respect to VSSH.

Waveform 1008 represents the voltage difference between SIG_OUT and VSSH 205. Waveform 1010 represents VDDH 206, and waveform 1012 represents VSSH 205. Waveform 1014 represents the signal at $V_{SET}$ input 118, while waveform 1016 represents the signal at $V_{RESET}$ input 120.

In one example, pulses received at $V_{SET}$ input 118 or $V_{RESET}$ input 120 change the signal output SIG_OUT. Waveform 1010 and waveform 1012 show the ringing caused by the switching converter. At approximately time $t_1$, a pulse is received at $V_{SET}$ input 118 (waveform 1014). This pulse causes the ringing shown in waveforms 1010 and 1012, which may be caused by the common mode noise. Some ringing is also seen in waveform 1002, which is the voltage difference between VDDH 206 and VSSH 205. At time $t_1$, after the pulse is received, the voltage at node V2 238 goes low (waveform 1004) and the voltage at node V1 236 goes high. As described above, this voltage differential between node V1 236 and V2 238 causes isolation circuitry 108 to provide a signal to latch 110 to set the SIG_OUT signal. Therefore, at time $t_1$, SIG_OUT goes high, as shown in waveform 1008.

In another example, at time $t_2$, a pulse is received at $V_{RESET}$ input 120 (waveform 1016). This pulse causes additional ringing shown in waveforms 1010 and 1012, which may be caused by the common mode noise. Some ringing is also seen in waveform 1002 at time $t_2$. At time $t_2$, after the pulse is received, the voltage at node V2 238 goes high (waveform 1004) and the voltage at node V1 236 goes low. As described above, this voltage differential between node V1 236 and V2 238 causes isolation circuitry 108 to provide a signal to latch 110 to reset the SIG_OUT signal. Therefore, at time $t_2$, SIG_OUT goes low, as shown in waveform 1008. Other example circuit architectures for the level shifter described herein behave similarly as shown in graphs 1000.

Common mode currents at the input of the current comparator may be coupled to the output latch in existing architectures. The examples described herein add an input dead zone to a current comparator to reject this common mode noise. Rejecting the common mode noise as described herein can prevent the output latch from being disturbed by noise. The output latch may be designed to be more sensitive to the actual set and reset inputs or a faster response. The use of cross-coupled transistors to decouple the output latch from the current comparator is a simple and effective solution. The cross-coupled transistors allow the current comparator to pull down one side of the output latch responsive to the input current difference reaching a programmed threshold. This example isolates the output latch from low differential input noise caused by supply switching and ringing. In some examples, the common mode currents may be canceled with a replica branch that helps the current comparator avoid saturation.

In examples herein, the output latch is decoupled or isolated from the inputs of the level shifter if no differential input current exists or if a low differential input current exists. The output latch can therefore be designed to be smaller or weaker such that its state may be flipped quickly by the intended set or reset input pulse. Propagation delays may be reduced in some examples with the level shifter architectures described herein.

The examples herein may be implemented in a variety of end equipment applications, includes consumer devices such as battery chargers and display drivers. The examples may also be useful for any DC-DC converter with a floating gate driver.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A level shifter comprising:
a low side having first and second inputs; and
a high side including:
 a latch having first and second terminals;
 a current comparator including first, second, third, and fourth current mirrors; and
 isolation circuitry including first and second transistors, in which the first transistor has a first control terminal, a first current terminal, and a second current terminal, the second transistor has a second control terminal, a third current terminal, and a fourth current terminal,
 wherein:
  the first current terminal is coupled to the first terminal of the latch,
  the second current terminal is coupled to the third current mirror,
  the third current terminal is coupled to the second terminal of the latch,
  the fourth current terminal is coupled to the fourth current mirror,
  the first current mirror is coupled to the third current mirror,
  the second current mirror is coupled to the fourth current mirror,
  the first current mirror includes a third transistor and a fourth transistor,
  the second current mirror includes a fifth transistor and a sixth transistor,
  the current comparator includes a seventh transistor having a third control terminal, a fifth current terminal, and a sixth current terminal,
  the current comparator includes an eighth transistor having a fourth control terminal, a seventh current terminal, and an eighth current terminal,
  the fifth current terminal is coupled to the third current mirror,
  the seventh current terminal is coupled to the fourth current mirror,
  the sixth current terminal is coupled to the eighth current terminal,
  the third control terminal is coupled to the second current mirror, and
  the fourth control terminal is coupled to the first current mirror.

2. The level shifter of claim 1, further comprising:
an output buffer coupled to the latch, wherein the output buffer has a first output and a second output.

3. The level shifter of claim 1, wherein the first current mirror is coupled to the first input, and wherein the second current mirror is coupled to the second input.

4. The level shifter of claim 1, wherein the latch includes a first inverter and a second inverter.

5. The level shifter of claim 1, wherein the third current mirror includes a ninth transistor and a tenth transistor, the ninth and tenth transistors having an N:1 size ratio.

6. The level shifter of claim 5, wherein the fourth current mirror includes an eleventh transistor and a twelfth transistor, the eleventh and twelfth transistors having an N:1 size ratio.

7. A level shifter comprising:
a high side having first and second inputs; and
a low side including:
 a latch having first and second terminals;
 a current comparator including first and second current mirrors; and
 isolation circuitry including first and second transistors, in which the first transistor has a first control terminal, a first current terminal, and a second current terminal, the second transistor has a second control terminal, a third current terminal, and a fourth current terminal,
 wherein:
  the first current terminal is coupled to the first terminal of the latch,
  the second current terminal is coupled to a fifth current terminal of a third transistor,
  a control terminal of the third transistor coupled to the first current mirror,
  the third current terminal is coupled to the second terminal of the latch,
  the fourth current terminal is coupled to a seventh current terminal of a fourth transistor,
  a control terminal of the fourth transistor coupled to the second current mirror,
  a sixth current terminal of the third transistor is coupled to an eighth current terminal of the fourth transistor,
  the fifth current terminal of the third transistor is coupled to a ninth current terminal of a fifth transistor,
  the seventh terminal of the fourth transistor is coupled to an eleventh current terminal of a sixth transistor,
  a tenth current terminal of the fifth transistor is coupled with a twelfth current terminal of the sixth transistor,
  a control terminal of the fifth transistor is coupled to the second current mirror, and
  a control terminal of the sixth transistor is coupled to the first current mirror.

8. The level shifter of claim 7, wherein the first current mirror is coupled to the first input, and wherein the second current mirror is coupled to the second input.

9. The level shifter of claim 7, wherein:
the first current mirror includes a seventh transistor;
the second current mirror includes an eighth transistor; and
the third and the seventh transistors have an N:1 size ratio.

10. The level shifter of claim 9, wherein the fourth and the eighth transistors have an N:1 size ratio.

11. A level shifter comprising:
a low side having first and second inputs configured to receive one or more signals that switch an output of the level shifter; and
a high side including:
 a latch having first and second terminals;
 a current comparator including first, second, third, and fourth current mirrors, wherein the current comparator is configured to perform a current comparison between a first current and a second current; and isolation circuitry including first and second transistors, in which the first transistor has a first control terminal, a first current terminal, and a second current terminal, the second transistor has a second control terminal, a third current terminal, and a fourth current terminal, wherein:
the first current terminal is coupled to the first terminal of the latch,
the second current terminal is coupled to the third current mirror,
the third current terminal is coupled to the second terminal of the latch,
the fourth current terminal is coupled to the fourth current mirror,
the first current mirror is coupled to the third current mirror,
the second current mirror is coupled to the fourth current mirror,
the first current mirror includes a third transistor and a fourth transistor,
the second current mirror includes a fifth transistor and a sixth transistor,
the current comparator includes a seventh transistor having a third control terminal, a fifth current terminal, and a sixth current terminal,
the current comparator includes an eighth transistor having a fourth control terminal, a seventh current terminal, and an eighth current terminal,
the fifth current terminal is coupled to the third current mirror,
the seventh current terminal is coupled to the fourth current mirror,
the sixth current terminal is coupled to the eighth current terminal,
the third control terminal is coupled to the second current mirror,
the fourth control terminal is coupled to the first current mirror,
and
the isolation circuitry is configured to isolate the current comparator from the latch.

12. The level shifter of claim 11, wherein the latch is configured to provide the output of the level shifter based at least in part on the current comparison.

13. The level shifter of claim 11, further comprising:
an output buffer coupled to the latch, wherein the output buffer has a first output and a second output.

14. The level shifter of claim 11, wherein the first current mirror is coupled to the first input, and wherein the second current mirror is coupled to the second input.

15. The level shifter of claim 11, wherein the third current mirror includes a ninth transistor and a tenth transistor, the ninth and tenth transistors having an N:1 size ratio.

16. The level shifter of claim 15, wherein the fourth current mirror includes an eleventh transistor and a twelfth transistor, the eleventh and twelfth transistors having an N:1 size ratio.

17. The level shifter of claim 16, wherein the isolation circuitry is configured to isolate the current comparator from the latch based at least in part on the current comparison and the N:1 size ratio.

18. The level shifter of claim 17, wherein a larger N:1 ratio increases a range of the current comparison where the isolation circuitry isolates the current comparator from the latch.

19. The level shifter of claim 11, wherein the current comparator is configured to reject common mode noise based on a ratio between the first current and the second current.

20. The level shifter of claim 11, further comprising:
a replica branch configured to replicate a common mode current and provide a replicated common mode current to the low side.

21. The level shifter of claim 20, wherein the replica branch is configured to subtract the common mode current from the first current and the second current.

* * * * *